(12) United States Patent
Weaver et al.

(10) Patent No.: US 11,817,332 B2
(45) Date of Patent: Nov. 14, 2023

(54) MULTI-WAFER VOLUME SINGLE TRANSFER CHAMBER FACET

(71) Applicant: Applied Materials, Inc., Santa Clara, CA (US)

(72) Inventors: William T. Weaver, Austin, TX (US); Andrew J. Constant, Cupertino, CA (US); Shay Assaf, Gilroy, CA (US); Jacob Newman, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 433 days.

(21) Appl. No.: 17/028,281

(22) Filed: Sep. 22, 2020

(65) Prior Publication Data

US 2021/0090917 A1    Mar. 25, 2021

Related U.S. Application Data

(60) Provisional application No. 63/022,583, filed on May 11, 2020, provisional application No. 62/903,913, filed on Sep. 22, 2019.

(51) Int. Cl.
*H01L 21/67*    (2006.01)

(52) U.S. Cl.
CPC .............................. *H01L 21/67201* (2013.01)

(58) Field of Classification Search
CPC ......... H01L 21/67201; H01L 21/67184; H01L 21/67757; H01L 21/67748
USPC .................................. 414/935–941; 118/719
See application file for complete search history.

(56) References Cited

U.S. PATENT DOCUMENTS

| | | | | |
|---|---|---|---|---|
| 4,907,526 | A * | 3/1990 | Walde | C23C 14/566 118/500 |
| 6,048,154 | A * | 4/2000 | Wytman | H01L 21/67748 414/811 |
| 6,059,507 | A * | 5/2000 | Adams | H01L 21/67778 414/217 |
| 9,303,788 | B2 * | 4/2016 | Hara | H01L 21/67201 |
| 9,378,994 | B2 * | 6/2016 | Weaver | H01L 21/67201 |
| 10,468,278 | B2 * | 11/2019 | Ishizawa | H01L 21/67745 |
| 2017/0271054 | A1 | 9/2017 | Ogawa et al. | |
| 2021/0280441 | A1 | 9/2021 | Amikura et al. | |

FOREIGN PATENT DOCUMENTS

| | | | |
|---|---|---|---|
| JP | H10242234 A | 9/1998 | |
| JP | H1187467 A | 3/1999 | |
| JP | 2014096436 A | 5/2014 | |
| KR | 20060097305 | * 9/2006 | ............. H01L 21/20 |
| KR | 20060097305 A | 9/2006 | |

OTHER PUBLICATIONS

Machine Translation of KR20060097305, 2004022243, 6 pages.
PCT International Search Report and Written Opinion in PCT/US2020/051969 dated Jan. 12, 2021, 10 pages.

* cited by examiner

*Primary Examiner* — Lynn E Schwenning
(74) *Attorney, Agent, or Firm* — Servilla Whitney LLC (57) ABSTRACT

Embodiments of the disclosure are directed to load lock chambers and methods of using load lock chambers. The load lock chambers include a middle section, an upper section connected to the middle section and a lower section connected to the middle section. A slit valve in a facet on the outside of the middle section provides an opening to access the middle volume from outside the load lock.

17 Claims, 5 Drawing Sheets

MULTI-WAFER VOLUME SINGLE TRANSFER CHAMBER FACET

CROSS-REFERENCE TO RELATED APPLICATIONS

This application claims priority to U.S. Provisional Application No. 62/903,913, filed Sep. 22, 2019 and U.S. Provisional Application No. 63/022,583, filed Jun. 11, 2020, the entire disclosures of which are hereby incorporated by reference herein.

TECHNICAL FIELD

Embodiments of the disclosure generally relate to semiconductor manufacturing equipment. In particular, embodiments of disclosure relate to transfer chambers for semiconductor manufacturing.

BACKGROUND

Large multi-chamber processing tools, also called cluster tools, are commonly used in semiconductor manufacturing. Generally, a plurality of process chambers is arranged around a central transfer station. A robot in the central transfer station moves substrates between the various processing chambers in a coordinated sequence to perform predetermined processes on the substrates. Process chambers commonly used in cluster tools include, for example, atomic layer deposition (ALD) chambers, chemical vapor deposition (CVD) chambers, physical vapor deposition (PVD) chamber, etch chambers, conditioning chambers, treatment chambers, heating chambers, etc.

Frequently, wafer handling requirements for a process need additional wafer chamber spaces (e.g., for loadlocks, heating stations, cooling stations, or combination function stations) to satisfy throughput or process requirements. There, there is a need for apparatus and methods to increase the number of available substrate process stations without increasing overall footprint of the cluster tool.

SUMMARY

One or more embodiments of the disclosure are directed to load lock chambers comprising a middle section, an upper section and a lower section. The middle section has having an inside surface containing a middle volume and an outside surface with a first middle facet configured to connect to a cluster tool. The first middle facet has a slit valve opening providing access to the middle volume through the outside surface. The upper section is positioned along an axis of the chamber and is connected to a top of the middle section. The upper section has an inside surface containing an upper volume. The upper section is isolatable from the middle section by an upper movable partition. The lower section is positioned along the axis of the chamber and is connected to a bottom of the middle section. The lower section has an inside surface containing a lower volume and is isolatable from the middle section by a lower moving partition.

Additional embodiments of the disclosure are directed to processing methods comprising: creating a process environment in a middle volume of a middle section of a load lock chamber having a middle section, an upper section and a lower section positioned along an axis of the load lock chamber, the upper section connected to a top of the middle section and the lower section connected to a bottom of the middle section, the upper section isolatable from the middle section by an upper movable partition and the lower section isolatable from the middle section by a lower movable partition; creating the process environment in an upper volume of the upper section, the upper volume having an upper substrate support connected to an upper motor, the upper motor configured to move the upper substrate support between the upper volume and the middle volume; opening an upper partition to allow the upper substrate support to move between the upper volume and the middle volume; moving the upper substrate support from the upper volume to the middle volume or from the middle volume to the upper volume; closing the upper partition to isolate the upper volume from the middle volume; creating the process environment in a lower volume of the lower section, the lower volume having a lower substrate support connected to a lower motor, the lower motor configured to move the lower substrate support between the lower volume and the middle volume; opening a lower partition to allow the lower substrate support to move between the lower volume and the middle volume; moving the lower substrate support from the lower volume to the middle volume or from the middle volume to the lower volume; closing the lower partition to isolate the lower volume from the middle volume; opening a slit valve in a facet of an outside surface of the middle section to allow access to the middle volume through the outside surface; accessing the middle volume through the slit valve in the outside surface to move a substrate between the middle volume a volume outside of the load lock chamber; and closing the slit valve in the facet of the outside surface of the middle section to isolate the middle volume from the outside surface.

Further embodiments of the disclosure are directed to non-transitory computer readable medium including instructions, that, when executed by a controller of a load lock chamber, causes the load lock chamber to perform operations of: creating a process environment in one or more of a middle volume, an upper volume or a lower volume of the load lock chamber; opening and/or closing one or more of an upper partition or lower partition to allow and/or prevent movement between the upper volume and/or lower volume and the middle volume; moving one or more of an upper substrate support or a lower substrate support between the upper volume and the middle volume or between the lower volume and the middle volume; opening and/or closing one or more slit valves in a facet of one or more of the middle section, upper section or lower section; and accessing one or more of the middle volume, upper volume or lower volume through the slit valve.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Figure 1:
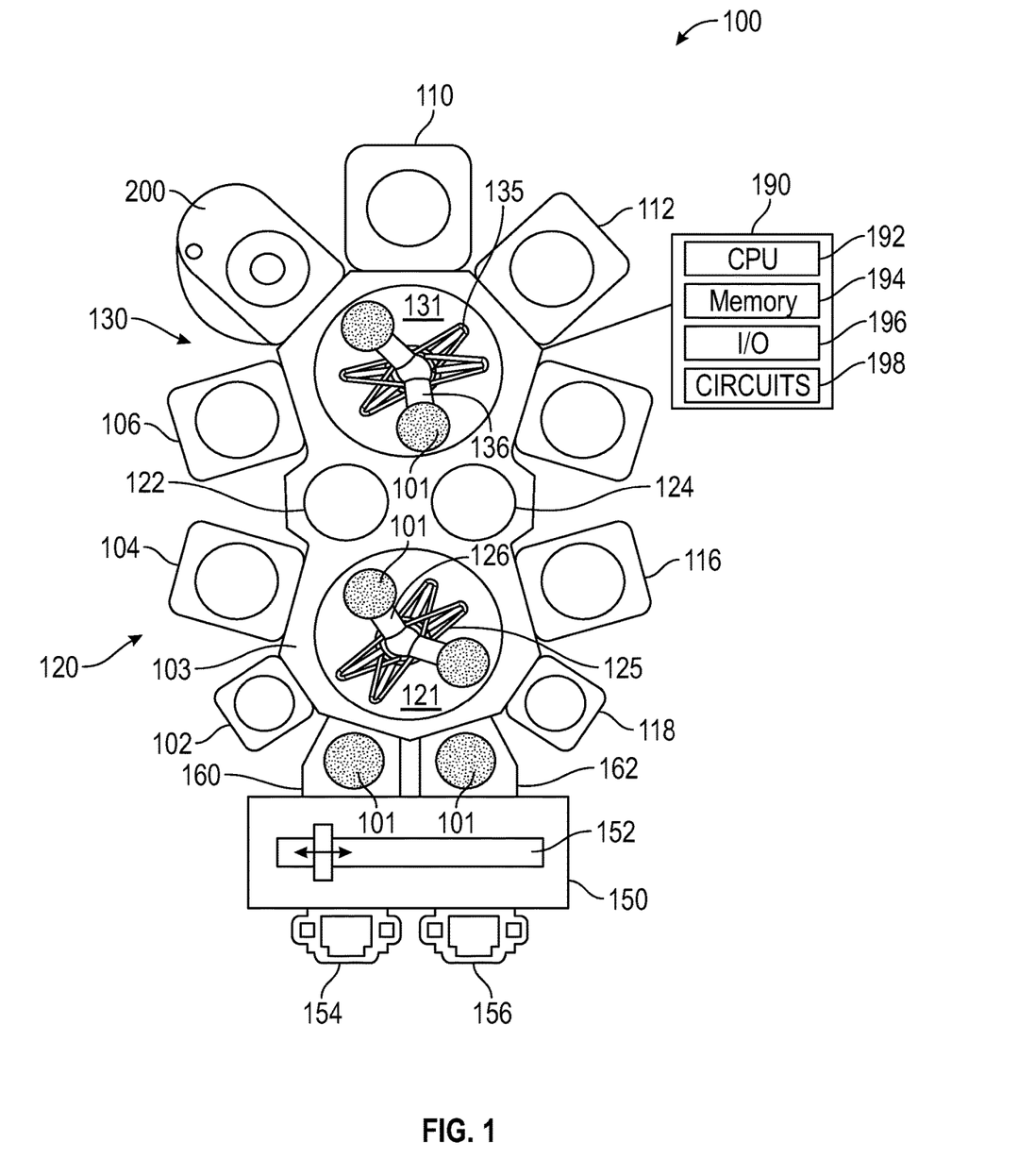
FIG. 1 shows a cluster tool in accordance with one or more embodiment of the disclosure.

FIG. 1 illustrates a cluster tool 100 for semiconductor manufacturing processes. The cluster tool 100 illustrated includes at least one central transfer station 121, 131 with a plurality of sides. In the illustrated embodiment, the cluster tool 100 has a first central transfer station 121 and a second central transfer station 131. The term "central" using in this manner does not imply a specific location; rather, the term refers to a general description of a component in which more than one chamber is connected to and which a substrate passes through during processing. Each central transfer station 121, 131 includes at least one robot 125, 135 positioned therein. The robots 125, 135 are configured to move at least one robot blade 126, 136 and a wafer 101 to each side of the central transfer station 121, 131. Each side of a central transfer station 121, 131 has at least one chamber connected thereto.

The illustrated cluster tool 100 comprises a plurality of processing chambers 102, 104, 106, 110, 112, 114, 116, and 118, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber and crystallization agent removal chamber. The particular arrangement of process chambers and components can be varied depending on the cluster tool and should not be taken as limiting the scope of the disclosure.

The deposition chamber of some embodiments comprises one or more of an atomic layer deposition chamber, a plasma enhanced atomic layer deposition chamber, a chemical vapor deposition chamber, a plasma enhanced chemical vapor deposition chamber or a physical deposition chamber. In some embodiments, the cluster tool 100 includes a pre-cleaning chamber connected to the central transfer station.

In the embodiment shown in FIG. 1, a factory interface 150 is connected to a front of the cluster tool 100. The factory interface 150 includes a loading chamber 154 and an unloading chamber 156 on a front 151 of the factory interface 150. While the loading chamber 154 is shown on the left and the unloading chamber 156 is shown on the right, those skilled in the art will understand that this is merely representative of one possible configuration.

The size and shape of the loading chamber 154 and unloading chamber 156 can vary depending on, for example, the substrates being processed in the cluster tool 100. In the embodiment shown, the loading chamber 154 and unloading chamber 156 are sized to hold a wafer cassette with a plurality of wafers positioned within the cassette.

A robot 152 is within the factory interface 150 and is configured to move between the loading chamber 154 and the unloading chamber 156. The robot 152 is configured to transfer a wafer 101 from a cassette in the loading chamber 154 through the factory interface 150 to load lock chamber 160. The robot 152 is also configured to transfer a wafer 101 from the load lock chamber 162 through the factory interface 150 to a cassette in the unloading chamber 156. As will be understood by those skilled in the art, the factory interface 150 can have more than one robot 152. For example, the factory interface 150 may have a first robot that transfers wafers between the loading chamber 154 and load lock chamber 160, and a second robot that transfers wafers 101 between the load lock 162 and the unloading chamber 156.

The cluster tool 100 shown has a first section 120 and a second section 130. The first section 120 is connected to the factory interface 150 through load lock chambers 160, 162. The first section 120 includes a first transfer chamber 121 with at least one robot 125 positioned therein. The robot 125 is also referred to as a robotic wafer transport mechanism. The first transfer chamber 121 is centrally located with respect to the load lock chambers 160, 162, process chambers 102, 104, 116, 118, and buffer chambers 122, 124. The robot 125 of some embodiments is a multi-arm robot capable of independently moving more than one wafer at a time. In some embodiments, the first transfer chamber 121 comprises more than one robotic wafer transfer mechanism. The robot 125 in first transfer chamber 121 is configured to move wafers between the chambers around the first transfer chamber 121. Individual wafers are carried upon a wafer transport blade that is located at a distal end of the first robotic mechanism.

After processing a wafer in the first section 120, the wafer can be passed to the second section 130 through a pass-through chamber. For example, chambers 122, 124 can be uni-directional or bi-directional pass-through chambers. The pass-through chambers 122, 124 can be used, for example, to cryo cool the wafer before processing in the second section 130, or allow wafer cooling or post-processing before moving back to the first section 120.

A system controller 190 is in communication with the first robot 125, second robot 135, first plurality of processing chambers 102, 104, 116, 118 and second plurality of processing chambers 106, 110, 112, 114. The system controller 190 can be any suitable component that can control the processing chambers and robots. For example, the system controller 190 can be a computer including a central processing unit, memory, suitable circuits and storage.

Processes may generally be stored in the memory of the system controller 190 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

One or more embodiments of the disclosure are directed to apparatus and methods to enable a single transfer chamber facet of a cluster tool to accommodate multiple wafer volumes. In some embodiments, the multiple wafer volumes are used as load locks, heating volumes, cooling volumes, a combination of these functions, etc. This can be accomplished without requiring the vacuum robot to have additional Z axis motion (because the wafer chamber spaces provide this).

Embodiments of the disclosure enable modification of existing systems without having to change the vacuum robot Z axis, transfer chamber volume, etc. Some embodiments provide the ability to double the number of wafer chamber spaces for an existing number of transfer chamber facets, existing vacuum robot Z axis, and existing transfer chambers typically only provide two load lock facets (each with a single wafer transfer plane for the vacuum robot) but with this approach you can double the number of load lock facets without changing the single wafer transfer plane, Z axis robot, etc.

Some embodiments of the disclosure provide apparatus that create three volumes at each load lock facet (upper, middle, and lower volume). In some embodiments, the apparatus is referred to as a load lock chamber. The skilled artisan will recognize that this term is used to describe the claimed apparatus because the middle volume can act in a manner similar to a load lock chamber. The middle volume interacts with the transfer chamber and the upper and lower volumes. In some embodiments, the upper and lower volumes interact with the middle volume, and the middle volume interacts with the factory interface (FI).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 10 degrees or at other orientations) and the spatially relative descriptors used herein interpreted accordingly.

In an exemplary embodiment, a wafer moves from the FI into the mainframe through the upper or lower volumes. The upper or lower volume is pumped down to the desired vacuum level. Once that vacuum level is achieved, the large door between the middle volume and the upper or lower volume opens so that the wafers can be moved into the middle volume. The vacuum robot in the transfer chamber can interact with the wafers once they are moved into this middle volume. While the upper volume is interacting with the transfer chamber (through the middle volume), the lower volume can be interacting with the FI, pumping or venting, heating or cooling, etc. This can be done at a different pressure than the upper and middle volume (which are a single volume at that time because the door between the upper and middle volumes is open). The volumes can be adjusted to accommodate whatever number of wafers is chosen.

In some embodiments, heating and/or cooling stations are integrated into the volumes. In some embodiments, heating and/or cooling is incorporated into the substrate supports in the upper and lower volumes. Some embodiments have variable pitch load lock to accommodate large numbers of wafers.

Figure 2:
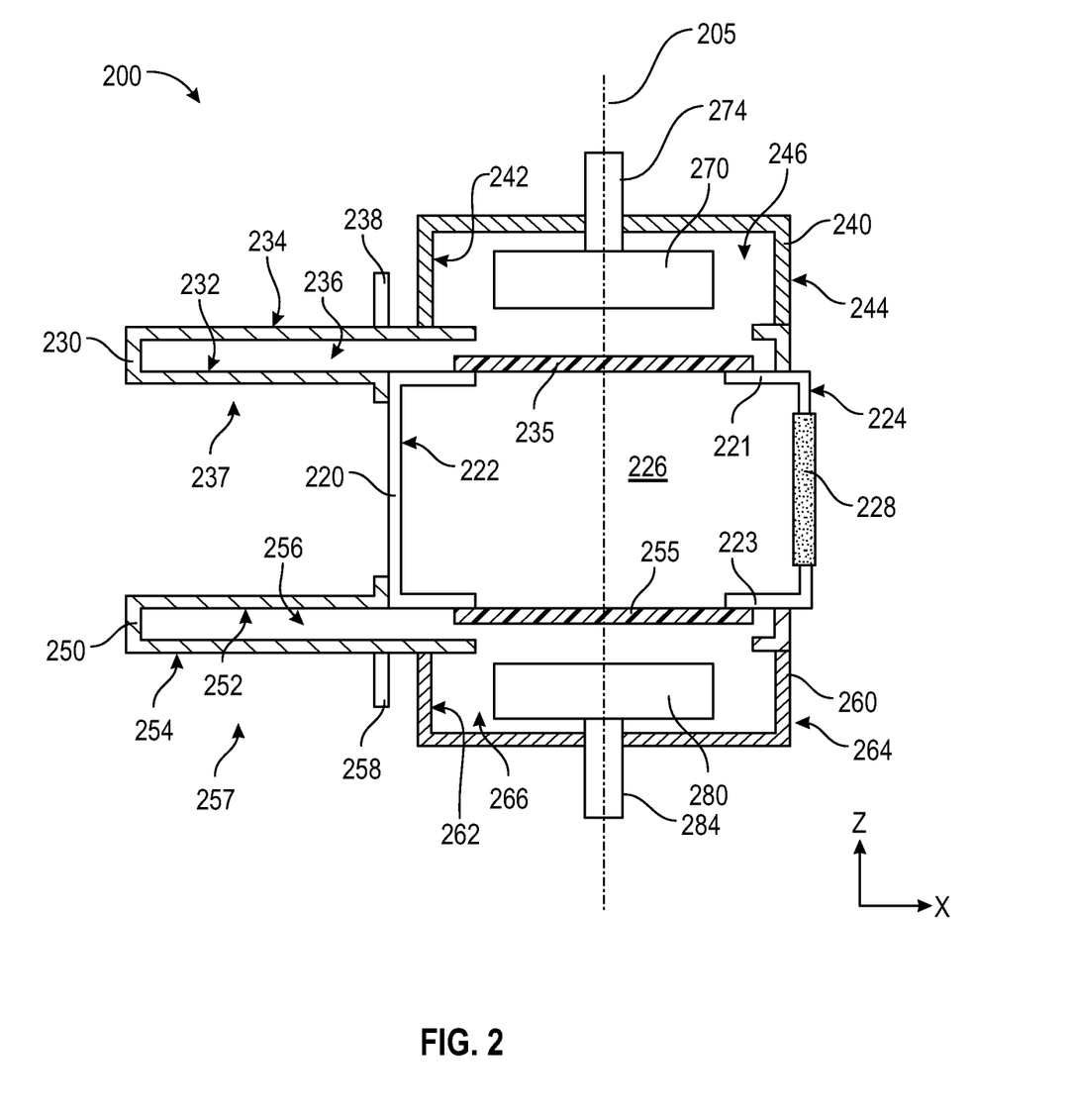
FIG. 2 shows a cross-sectional schematic view of a load lock chamber according to one or more embodiment of the disclosure.

FIGS. 2 through 5 illustrate one or more embodiments of a load lock chamber 200. FIG. 2 illustrates a schematic cross-sectional view of a load lock chamber 200. The shading using in the Figures is intended to aid in differentiating components and should not be taken as limiting any particular material of construction.

Figure 3:
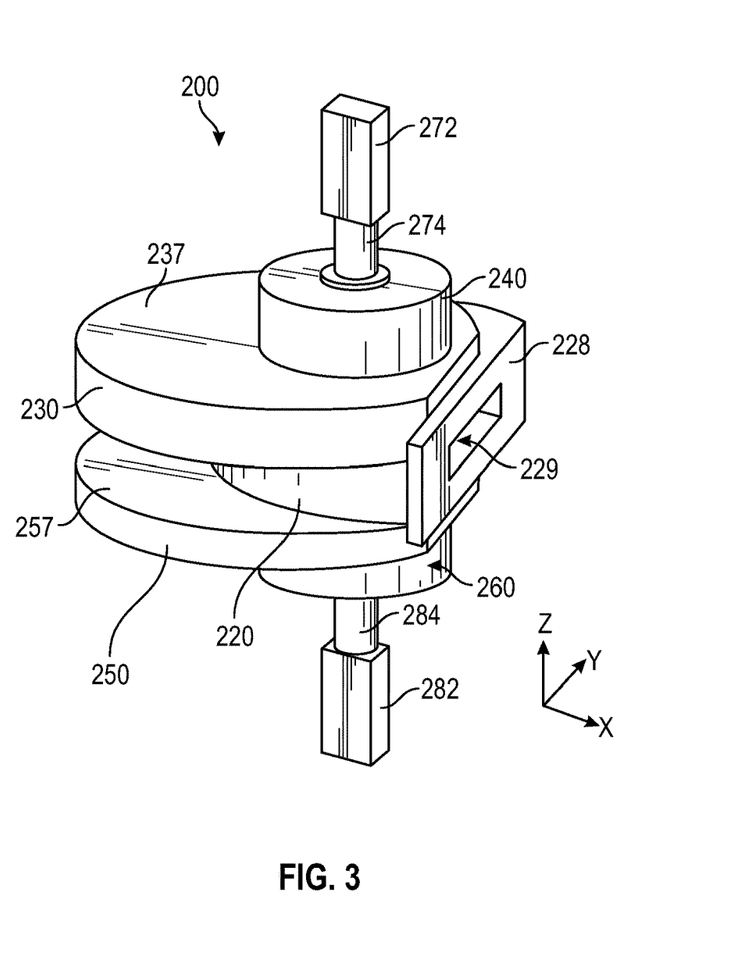
FIG. 3 shows a parallel projection view of a load lock chamber according to one or more embodiment of the disclosure.

Referring now to FIGS. 2 and 3, one or more embodiment of the load lock chamber 200 is illustrated. The middle section 220 of the load lock chamber 200 has an inside surface 222 and an outside surface 224 defining a middle section wall thickness. The inside surface 222 contains the middle volume 226.

The outside surface 224 has a first middle facet 228. As used in this manner, the term "facet" refers to a portion of the subject apparatus with a shaped surface configured to interact with a surface of another component. For example, the facet illustrated in FIG. 3 is flat and, as shown in FIG. 1, connects to a flat surface on the outside of the second central transfer station 131. The first middle facet 228 is configured to connect to a cluster tool 100 and has a slit valve opening 229 which provides access to the middle volume 226 through the outside surface 224 and wall of the middle section 220.

The load lock chamber 200 has an axis 205 that, for descriptive purposes only, is oriented vertically. Components described using vertically oriented descriptors (e.g., above, upper, below, lower) are spaced along the axis 205. In some embodiments, the axis 205 is referred to as the Z-axis. In some embodiments, the axis 205 is referred to as extending along a first direction. The skilled artisan will recognize that usage of spatially oriented language does not imply a fixed orientation in space.

The load lock chamber 200 includes an upper section 240 positioned along the axis 205 above the middle section 220. The upper section 240 is connected to a top 221 of the middle section 220. In the illustrated embodiment, the upper section 240 connects to the top 221 of the middle section 220 through an upper partition section as described further below. In some embodiments, the upper section 240 connects directly to the top 221 of the middle section 220 without an intervening section.

The upper section 240 has an inside surface 242 and an outside surface 244 defining a thickness of the wall of the upper section 240. The inside surface 242 contains an upper volume 246. The boundary of the upper volume 246 relative to the middle volume 226 is not specific when there is no physical barrier between. When a physical barrier, for example partition 235, is positioned between the upper volume 246 and the middle volume 226, the physical barrier defines a boundary of the upper volume 246 and the middle volume 226.

The upper section 240 is isolatable from the middle section 220 by an upper movable partition 235. Stated differently, in some embodiments, the upper volume 246 is isolatable from the middle volume 226 by upper movable partition 235.

In some embodiments, the upper movable partition 235 is in an upper partition section 230 of the load lock chamber 200. The upper partition section 230 has an inside surface 232 and an outside surface 234. The inside surface 232 containing the upper partition volume 236. The movable upper partition 235 is within the upper partition volume 236.

Figure 6A:
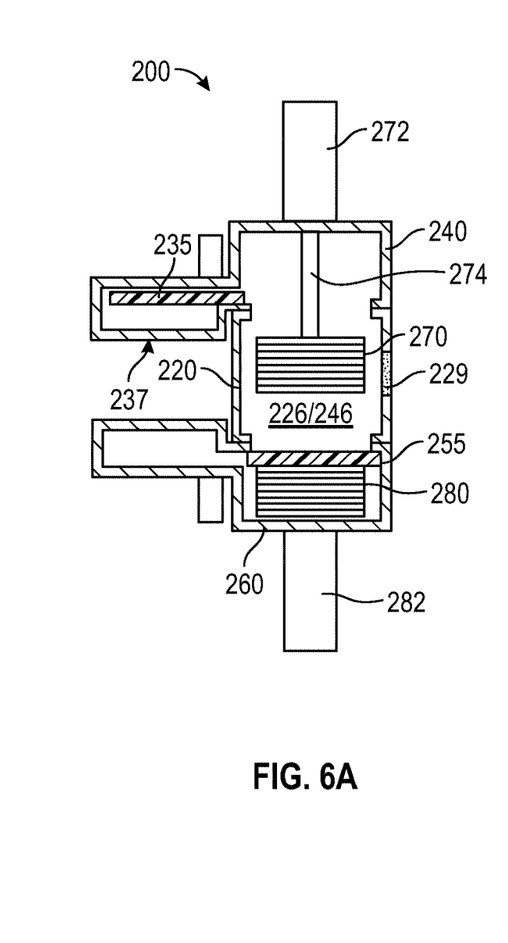
FIGS. 6A through 6C show cross-sectional schematic views of a load lock chamber in use according to one or more embodiment of the disclosure.

In some embodiments, the upper partition section 230 includes an upper partition actuator 238. The upper partition actuator 238 can be any suitable actuator/motor known to the skilled artisan for use in a vacuum processing chamber that is configured to move the partition 235. In some embodiments, the upper partition actuator 238 is configured to move the upper partition 235 from a sealing position (as illustrated in FIG. 2) between the middle sections 220 and the upper section 240 to an open position (as shown in FIG. 6A) in which the partition 235 does not form a boundary to the upper volume 246 or the middle volume 226.

In some embodiments, the upper partition section 230 has an extension portion 237 that extends horizontally relative to the axis 205. For example, the extension portion 237 of the upper partition section 230 of some embodiments lies within the X-Y plane which is perpendicular to the axis 205. In some embodiments, the upper partition actuator moves the upper partition 235 at an angle in the range of 80° to 110° relative to the chamber axis 205. The skilled artisan will recognize that the upper partition can be moved in either direction relative to the chamber axis 205 depending on the orientation of the load lock chamber 200. For example, the movement direction of the upper partition in the illustrated drawings can be opposite for a mirror image component.

In some embodiments, the upper partition actuator 238 is configured to move the upper partition 235 into the extension portion 237. When in the extension portion 237, the upper partition 235 is in the open position.

The load lock chamber 200 includes a lower section 260 positioned along the axis 205 below the middle section 220. Stated differently, in some embodiments, the lower section 260 is on a side of the middle section 220 opposite the upper section 240 along the chamber axis 205. The lower section 260 is connected to the bottom 223 of the middle section 220. In the illustrated embodiment, the lower section 260 connects to the bottom 223 of the middle section 220 through a lower partition section 250 as described further below. In some embodiments, the lower section 260 connects directly to the bottom 223 of the middle section 220 without an intervening section.

The lower section 260 has an inside surface 262 and an outside surface 264 defining a thickness of the wall of the lower section 260. The inside surface 262 contains a lower volume 266. The boundary of the lower volume 266 relative to the middle volume 226 is not specific when there is no physical barrier between. When a physical barrier, for example partition 255, is positioned between the lower volume 266 and the middle volume 226, the physical barrier defines a boundary of the lower volume 266 and the middle volume 226.

The lower section 260 is isolatable from the middle section 220 by a lower movable partition 255. Stated differently, in some embodiments, the lower volume 266 is isolatable from the middle volume 226 by lower movable partition 255.

In some embodiments, the lower movable partition 255 is in a lower partition section 250 of the load lock chamber 200. The lower partition section 250 has an inside surface 252 and an outside surface 254. The inside surface 252 containing the lower partition volume 256. The movable lower partition 255 is within the lower partition volume 256.

In some embodiments, the lower partition section 250 includes a lower partition actuator 258. The lower partition actuator 258 can be any suitable actuator/motor known to the skilled artisan for use in a vacuum processing chamber that is configured to move the partition 255. In some embodiments, the lower partition actuator 258 is configured to move the lower partition 255 from a sealing position (as illustrated in FIG. 2) between the middle sections 220 and the lower section 260 to an open position (as shown in FIG. 6C) in which the partition 255 does not form a boundary to the lower volume 266 or the middle volume 226.

In some embodiments, the lower partition section 250 has an extension portion 257 that extends horizontally relative to the axis 205. For example, the extension portion 257 of the lower partition section 250 of some embodiments lies within the X-Y plane which is perpendicular to the axis 205. In some embodiments, the lower partition actuator 258 moves the lower partition 255 at an angle in the range of 80° to 110° relative to the chamber axis 205.

In some embodiments, the lower partition actuator 258 is configured to move the lower partition 255 into the extension portion 257. When in the extension portion 257, the lower partition 255 is in the open position.

An upper substrate support 270 is located within the upper section 240 and is movable to the middle section 220 when the upper partition 235 is in the open position. In some embodiments, an upper motor 272 (shown in FIG. 3) is connected to the upper section 240. The upper motor 272 is configured to move the upper substrate support 270 along the chamber axis 205 between the upper section 240 and the middle section 220. The upper motor 272 in FIG. 3 is connected to the upper section 240 through upper piston 274. The upper motor 272 includes motors, pneumatics, hydraulics or other components capable of moving the upper substrate support 270 along the chamber axis 205.

A lower substrate support 280 is located within the lower section 260 and is movable to the middle section 220 when the lower partition 255 is in the open position. In some embodiments, a lower motor 282 (shown in FIG. 3) is connected to the lower section 260. The lower motor 282 is configured to move the lower substrate support 280 along the chamber axis 205 between the lower section 260 and the middle section 220. The lower motor 282 in FIG. 3 is connected to the lower section 260 through lower piston 284. The lower motor 282 includes motors, pneumatics, hydraulics or other components capable of moving the lower substrate support 280 along the chamber axis 205.

Figure 4:
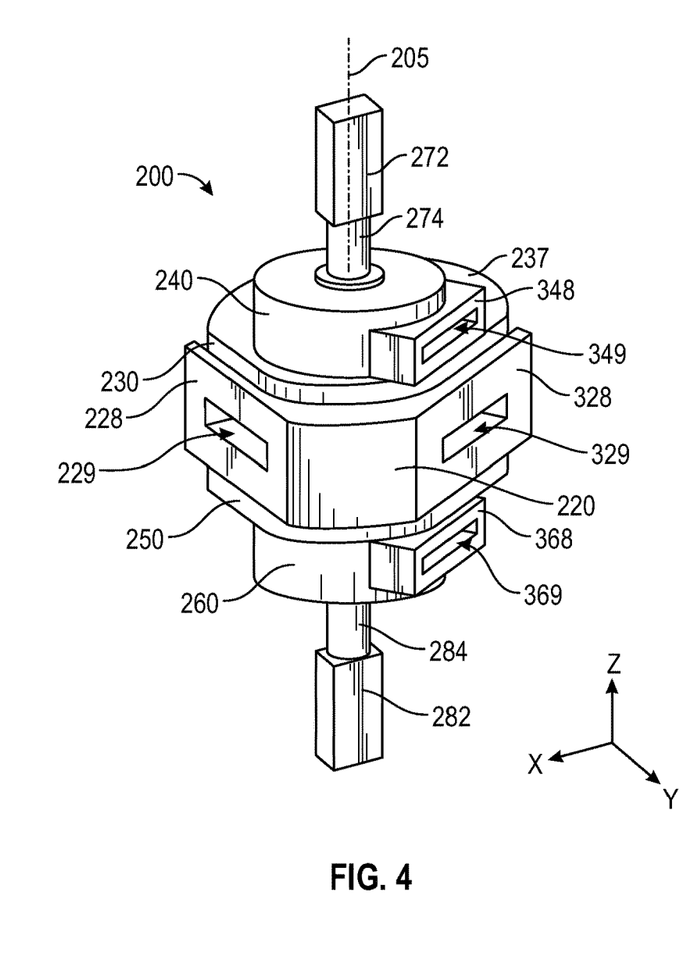
FIG. 4 shows a parallel projection view of a load lock chamber according to one or more embodiment of the disclosure.

Referring to FIG. 4, some embodiments of the load lock chamber 200 include a second middle facet 328 on the outside surface 224 of the middle section 220. The second middle facet 328 has a second slit valve opening 329 providing access to the middle volume 226 through the outside surface 224 and the wall of the middle section 220.

In the illustrated embodiment, the second middle facet 328 is about 90° around chamber axis 205 from the first middle facet 228. In some embodiments, a plane formed by the second middle facet 328 is at an angle in the range of 15° to 180° around the chamber axis 205 from the first middle facet 228.

In some embodiments, the second middle facet 328 is configured to be connected to a second facet of the cluster tool. For example, referring to FIG. 1, the second middle facet 328 of the load lock chamber 200 faces the side of processing chamber 110 and forms a connection to processing chamber 110. In some embodiments, the load lock chamber 200 is in place of buffer chamber 122 and/or buffer chamber 124 between the first section 120 and second section 130 of the cluster tool 100. In some embodiments of this sort, the load lock chamber 200 has a first middle facet 228 connected to the first central transfer station 121 and a second middle facet 328 connected to the second central transfer station 131.

In some embodiments, the second middle facet 328 is configured for atmospheric operation. For example, the second middle facet 328 of some embodiments is configured as a middle section 220 factory interface to allow movement of wafers into and out of the cluster tool 100.

In some embodiments, as shown in FIG. 4, one or more of the upper section 240 or lower section 260 includes a facet 348, 368 for interfacing with another component. In some embodiments, the outside surface 244 of the upper section 240 has an upper facet 348 with an upper slit valve opening 349 providing access to the upper volume 246 through the outside surface 244 and wall of the upper section 240.

In some embodiments, the upper facet 348 is configured for atmospheric operation. In some embodiments, the upper facet 348 is configured as an upper section 240 factory interface to allow movement of wafers into and out of the cluster tool 100.

In some embodiments, the outside surface 264 of the lower section 260 has a lower facet 368 with a lower slit valve opening 369 providing access to the lower volume 266 through the outside surface 264 and wall of the lower section 260. In some embodiments, the In some embodiments, the lower facet 368 is configured for atmospheric operation. In some embodiments, the lower facet 368 is configured as a lower section 260 factory interface to allow movement of wafers into and out of the cluster tool 100.

Figure 5:
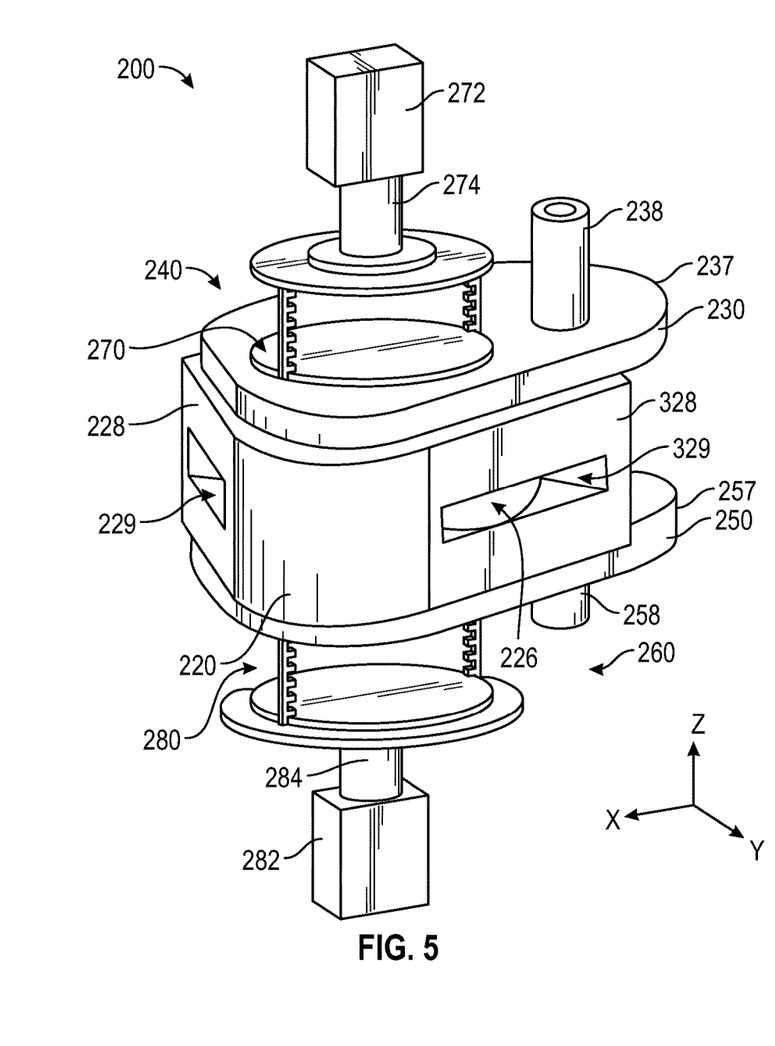
FIG. 5 shows a parallel projection view of a load lock chamber according to one or more embodiment of the disclosure.

FIG. 5 illustrates an embodiment of the load lock chamber 200 with a middle section 220 with a first middle facet 228 and a second middle facet 328. The walls of the upper section 240 and lower section 260 are omitted to show the substrate supports 270, 280 connected to pistons 274, 284.

Figure 5A:
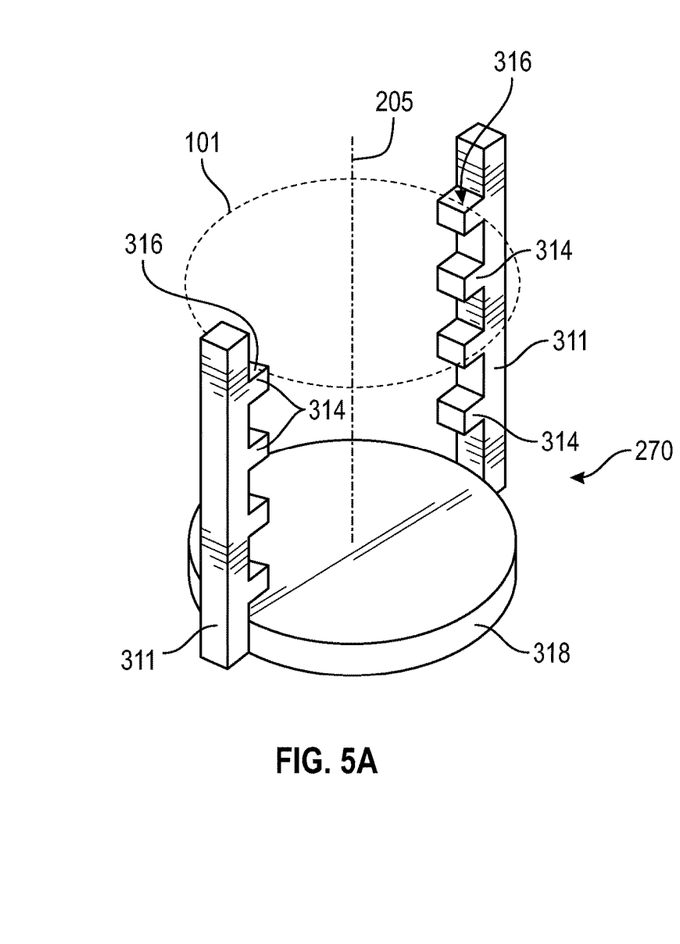
FIG. 5A shows a parallel projection view of a substrates support for use with a load lock chamber according to one or more embodiments of the disclosure.

The upper substrate support 270 and lower substrate support 280 can be the same type of support system or can be different. FIG. 5A shows an upper substrate support 270 according to one or more embodiment of the disclosure. A wafer 101 is shown in phantom to illustrate the orientation that the substrate would be supported in. The skilled artisan will understand that the lower substrate support 280 can be the same configuration as that shown in FIG. 5A and the embodiments described here with respect to the upper substrate support 270 are applicable to the lower substrate support 280.

In some embodiments, the upper substrate support 270 comprises a plurality of support beams 311 spaced a distance around the chamber axis 205. Each of the support beams 311 has a plurality of support fingers 314 extending inwardly from the support beams 311. The plurality of support fingers are spaced along the chamber axis 205 so that a substrate 101 can be supported on the support surface 316 of the support fingers 314 of each support beam 311.

In some embodiments, the substrate support comprises a plurality of heating and/or cooling plates 318. In the embodiment illustrated in FIG. 5A, there is only one heating and/or cooling plate 318 illustrated for description purposes. However, the skilled artisan will recognize that the heating and/or cooling plates 318 can be spaced along the chamber axis 205 like that support fingers 314.

Some embodiments of the cluster tool 100, as shown in FIG. 1, include a controller 190 configured to perform one or more actions to operate the load lock chamber 200. In some embodiments, the controller 190 is configured to perform one or more of: opening and/or closing the partitions 235, 255, actuate motors 272, 282 to move a substrate support 270, 280, open and/or close one or more slit valves 229, 329, 349, 369, open and/or close one or more atmospheric interface, heat a substrate support, cool a substrate support, enable a flow of gas into and/or out of the load lock chamber 200, the middle section 220, the upper section 240 and/or the lower section 260 individually.

Figure 6B:
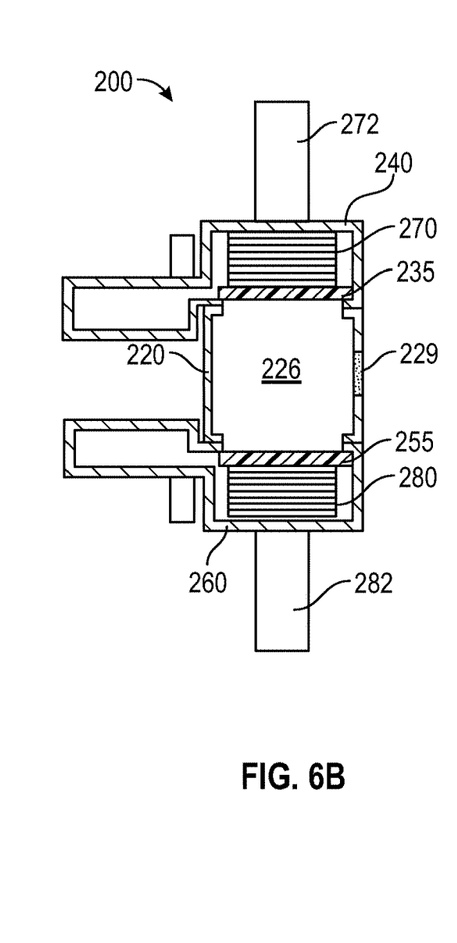
Figure 6C:
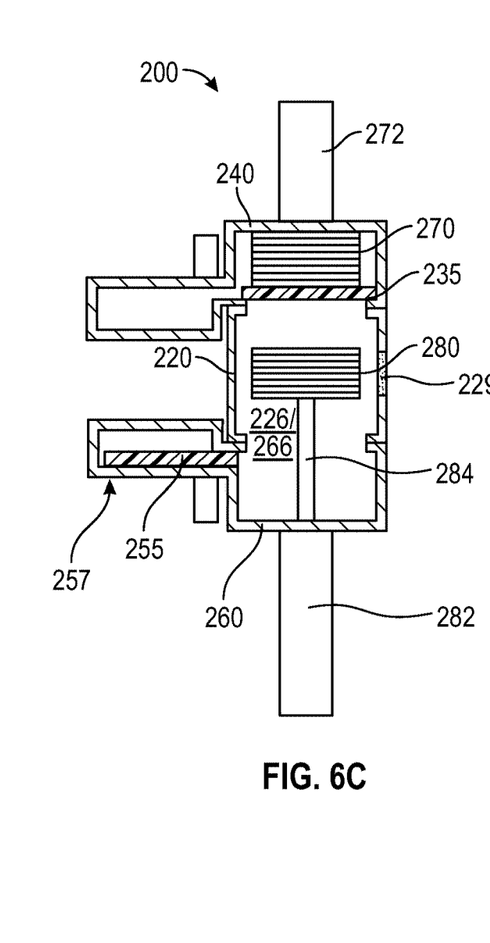

FIGS. 6A through 6C illustrated a method of using the load lock chamber 200. In FIG. 6A, the upper partition 235 is moved into the upper partition extension 237 so that the middle volume 226 and upper volume 246 are combined. The upper substrate support 270 is moved into the middle section 220 so that substrates can be accessed through slit valve 229.

Before opening the upper partition 235, a process environment is created in the middle section 220 (middle volume 226) and the upper section (upper volume 246). The process environment in the middle volume 226 and upper volume 246 are similar enough so that opening the partition 235 does not allow unintended gas phase reactions to occur.

After the substrates from the upper substrates support 270 are finished being used, removed or added to the substrate support, the upper substrate support 270 is moved to the upper volume 246 of the upper section 240. The movable upper partition 235 is moved into the closed position to isolate the upper volume 246 from the middle volume 226, as shown in FIG. 6B.

In the configuration of FIG. 6B, each of the middle section 220, upper section 240 and lower section 260 can have the same or different process environments. In some embodiments, one or more of the upper section 240 or lower section 260 have a process condition to treat the substrates, heat the substrates, cool the substrates, react with a film on the substrates, deposit a film on the substrates and/or etch a film on the substrates. The upper section 240 and/or lower section 260 can be used as a process chamber for any suitable process. In some embodiments, the middle section 220 is used as a process chamber as above, when a substrate support 270, 280 is in the middle volume 226.

In some embodiments, the isolated middle volume 226 is modified so that a process condition created in the lower section 260 is approximated. The movable lower partition 255 can then be moved to the open position, as shown in FIG. 6C, and the lower substrate support 280 can be moved to the middle section 220.

Some embodiments of an operating method comprise one or more of: creating the process environment in an upper volume of the upper section, the upper volume having an upper substrate support connected to an upper motor, the upper motor configured to move the upper substrate support between the upper volume and the middle volume; opening an upper partition to allow the upper substrate support to move between the upper volume and the middle volume; moving the upper substrate support from the upper volume to the middle volume or from the middle volume to the upper volume; closing the upper partition to isolate the upper volume from the middle volume; creating the process environment in a lower volume of the lower section, the lower volume having a lower substrate support connected to a lower motor, the lower motor configured to move the lower substrate support between the lower volume and the middle volume; opening a lower partition to allow the lower substrate support to move between the lower volume and the middle volume; moving the lower substrate support from the lower volume to the middle volume or from the middle volume to the lower volume; closing the lower partition to isolate the lower volume from the middle volume; opening a slit valve in a facet of an outside surface of the middle section to allow access to the middle volume through the outside surface; accessing the middle volume through the slit valve in the outside surface to move a substrate between the middle volume a volume outside of the load lock chamber; and/or closing the slit valve in the facet of the outside surface of the middle section to isolate the middle volume from the outside surface.

One or more embodiments of the disclosure are directed to non-transitory computer readable medium. The computer-readable medium includes instructions, that, when executed by a controller of a load lock chamber, causes the load lock chamber to perform operations of: creating a process environment in one or more of a middle volume, an upper volume or a lower volume of the load lock chamber; opening and/or closing one or more of an upper partition or lower partition to allow and/or prevent movement between the upper volume and/or lower volume and the middle volume; moving one or more of an upper substrate support or a lower substrate support between the upper volume and the middle volume or between the lower volume and the middle volume; opening and/or closing one or more slit valves in a facet of one or more of the middle section, upper section or lower section; and accessing one or more of the middle volume, upper volume or lower volume through the slit valve.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A load lock chamber comprising:
a middle section having an inside surface containing a middle volume and an outside surface with a first middle facet configured to connect to a cluster tool, the first middle facet having a slit valve opening providing access to the middle volume through the outside surface;
an upper section positioned along an axis of the chamber and connected to a top of the middle section and having an inside surface containing an upper volume, the upper section isolatable from the middle section by an upper movable partition, the upper movable partition in an upper partition section that extends horizontally relative to the chamber axis;
an upper partition actuator configured to move the upper partition from a sealing position between the middle section and the upper section and an open position;
a lower section positioned along the axis of the chamber and connected to a bottom of the middle section and having an inside surface containing a lower volume, the lower section isolatable from the middle section by a lower movable partition, the lower movable partition in a lower partition section that extends horizontally relative to the chamber axis; and
a lower partition actuator configured to move the lower partition from a sealing position between the middle section and the lower section and an open position.

2. The load lock chamber of claim 1, wherein the upper partition actuator moves the upper partition at an angle in the range of 80° to 110° relative to the chamber axis.

3. The load lock chamber of claim 1, wherein the lower partition actuator moves the lower partition at an angle in the range of 80° to 110° relative to the chamber axis.

4. The load lock chamber of claim 1, further comprising an upper motor connected to the upper section, the upper motor configured to move an upper substrate support along the chamber axis between the upper section and the middle section.

5. The load lock chamber of claim 4, wherein the upper substrate support comprises a plurality support beams spaced a distance around the chamber axis, each of the support beams having a plurality of support fingers extending inwardly from the support beams and spaced along the chamber axis so that a substrate can be supported on a support finger from each of the support beams.

6. The load lock chamber of claim 4, wherein the upper substrate support comprises a plurality of heating and/or cooling plates spaced along the chamber axis, each of the heating and/or cooling plates configured to support a substrate.

7. The load lock chamber of claim 1, further comprising a lower motor connected to the lower section, the lower motor configured to move a lower substrate support along the chamber axis between the lower section and the middle section.

8. The load lock chamber of claim 7, wherein the lower substrate support comprises a plurality support beams spaced a distance around the chamber axis, each of the support beams having a plurality of support fingers extending inwardly from the support beams and spaced along the chamber axis so that a substrate can be supported on a support finger from each of the support beams.

9. The load lock chamber of claim 7, wherein the lower substrate support comprises a plurality of heating and/or cooling plates spaced along the chamber axis, each of the heating and/or cooling plates configured to support a substrate.

10. The load lock chamber of claim 1, wherein the outside surface of the middle section further comprises a second middle facet having a second slit valve opening providing access to the middle volume through the outside surface.

11. The load lock chamber of claim 10, wherein the second middle facet is configured to be connected to a second facet of the cluster tool.

12. The load lock chamber of claim 10, wherein the second middle facet is configured for atmospheric operation to act as a middle section factory interface.

13. The load lock chamber of claim 1, wherein the outside surface of the upper section comprises an upper facet having an upper slit valve opening providing access to the upper volume through the outside surface.

14. The load lock chamber of claim 1, wherein the outside surface of the lower section comprises a lower facet having a lower slit valve opening providing access to the lower volume through the outside surface.

15. The load lock chamber of claim 1, further comprising a controller configured to perform one or more of: opening and/or closing the partitions, actuate motors to move a substrate support, open and/or close one or more slit valves, open and/or close one or more atmospheric interface.

16. A processing method comprising:
creating a process environment in a middle volume of a middle section of a load lock chamber having a middle section, an upper section and a lower section positioned along an axis of the load lock chamber, the upper section connected to a top of the middle section and the lower section connected to a bottom of the middle section, the upper section isolatable from the middle section by an upper movable partition and the lower section isolatable from the middle section by a lower movable partition;

creating the process environment in an upper volume of the upper section, the upper volume having an upper substrate support connected to an upper motor, the upper motor configured to move the upper substrate support between the upper volume and the middle volume;

opening an upper partition to allow the upper substrate support to move between the upper volume and the middle volume;

moving the upper substrate support from the upper volume to the middle volume or from the middle volume to the upper volume;

closing the upper partition to isolate the upper volume from the middle volume;

creating the process environment in a lower volume of the lower section, the lower volume having a lower substrate support connected to a lower motor, the lower motor configured to move the lower substrate support between the lower volume and the middle volume;

opening a lower partition to allow the lower substrate support to move between the lower volume and the middle volume;

moving the lower substrate support from the lower volume to the middle volume or from the middle volume to the lower volume;

closing the lower partition to isolate the lower volume from the middle volume;

opening a slit valve in a facet of an outside surface of the middle section to allow access to the middle volume through the outside surface;

accessing the middle volume through the slit valve in the outside surface to move a substrate between the middle volume a volume outside of the load lock chamber; and closing the slit valve in the facet of the outside surface of the middle section to isolate the middle volume from the outside surface.

17. A non-transitory computer readable medium including instructions, that, when executed by a controller of a load lock chamber, causes the load lock chamber to perform operations of:

creating a process environment in one or more of a middle volume, an upper volume or a lower volume of the load lock chamber;

opening and/or closing one or more of an upper partition or lower partition to allow and/or prevent movement between the upper volume and/or lower volume and the middle volume;

moving one or more of an upper substrate support or a lower substrate support between the upper volume and the middle volume or between the lower volume and the middle volume;

opening and/or closing one or more slit valves in a facet of one or more of the middle section, upper section or lower section; and accessing one or more of the middle volume, upper volume or lower volume through the slit valve.

* * * * *